United States Patent
Oi et al.

(10) Patent No.: US 7,928,557 B2
(45) Date of Patent: Apr. 19, 2011

(54) STACKED PACKAGE AND METHOD FOR MANUFACTURING THE PACKAGE

(75) Inventors: Kiyoshi Oi, Nagano (JP); Teruaki Chino, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 629 days.

(21) Appl. No.: 11/953,365

(22) Filed: Dec. 10, 2007

(65) Prior Publication Data

US 2008/0142944 A1 Jun. 19, 2008

(30) Foreign Application Priority Data

Dec. 13, 2006 (JP) ................................ P.2006-336276

(51) Int. Cl.
*H01L 23/48* (2006.01)
*H01L 23/02* (2006.01)
(52) U.S. Cl. ................. 257/697; 257/686; 257/E23.024
(58) Field of Classification Search .................. 257/686, 257/697, E23.024
See application file for complete search history.

(56) References Cited

U.S. PATENT DOCUMENTS

| 4,970,577 | A | * | 11/1990 | Ogihara et al. | 257/698 |
| 5,956,233 | A | * | 9/1999 | Yew et al. | 361/760 |
| 6,195,268 | B1 | * | 2/2001 | Eide | 361/803 |
| 7,358,603 | B2 | * | 4/2008 | Li et al. | 257/698 |
| 2004/0007774 | A1 | * | 1/2004 | Crane et al. | 257/723 |
| 2006/0289977 | A1 | * | 12/2006 | Master et al. | 257/678 |
| 2007/0235856 | A1 | * | 10/2007 | Haba et al. | 257/697 |

FOREIGN PATENT DOCUMENTS

JP 11-8474 1/1999

* cited by examiner

*Primary Examiner* — Nitin Parekh
(74) *Attorney, Agent, or Firm* — Drinker Biddle & Reath LLP

(57) ABSTRACT

In a stacked package in which a plurality of packages having semiconductor elements mounted on substrates are stacked, while being electrically connected together, by use of connection sections, wherein the connection sections are formed from pillar-like members and solder joint sections and the upper package is supported on the lower package by pillar-like members.

9 Claims, 7 Drawing Sheets

STACKED PACKAGE AND METHOD FOR MANUFACTURING THE PACKAGE

This application claims priority to Japanese Patent Application No. 2006-336276, filed Dec. 13, 2006, in the Japanese Patent Office. The priority application is incorporated by reference in its entirety.

TECHNICAL FIELD

The present disclosure relates to a stacked package and a method of manufacturing the package. More particularly, the present disclosure relates to a stacked package for which a plurality of packages are stacked while being electrically connected together by use of connection sections, and a method for manufacturing the package.

RELATED ART

A module product called a system-in-package realized by packing a plurality of semiconductor elements or passive components into a single package has recently been commercialized as described in; e.g., Patent Document 1. FIG. 7 shows a system-in-package 100 according to an example of the related art.

The system-in-package 100 shown in the drawing has a structure in which an upper package 112 is stacked on a lower package 111. A semiconductor element 120 is mounted on an upper surface of a lower substrate 114 by flip-chip bonding, and solder balls 116 are provided on a lower surface of the lower substrate 114. Moreover, upper electrodes 118 are formed on the upper surface of the lower substrate 114.

In the upper package 112, semiconductor elements 140 and 141 are stacked on an upper substrate 115, and the semiconductor elements 140 and 141 and the upper substrate 115 are connected to each other by wire bonding. The semiconductor elements 140 and 141 are sealed with resin. Further, lower electrodes 138 are formed on a lower surface of the upper substrate 115.

In order to mount the upper package 112 on the lower package 111, solder balls 113 for stacking purpose are interposed between the upper electrodes 118 and the lower electrodes 138, thereby electrically connecting the upper package 112 to the lower package 111 and supporting the upper package 112 on the lower package 111.

[Patent Document 1] Japanese Patent Unexamined Publication No. 11-008474

However, in the structure in which the solder balls 113 are used as means for electrically connecting the lower package 111 to the upper package 112 and means for supporting the upper package 112 on the lower package 111, a distance between the lower package 111 and the upper package 112 is determined by the size (diameter) of the solder balls 113.

Therefore, for instance, when the height of the lower package 111 is increased as a result of a plurality of semiconductor elements being stacked on the lower substrate 114 in the lower package 111, the diameter of the solder balls 113 must be increased correspondingly. When the diameter of the solder balls 113 is increased so as to correspond to the distance between the packages 111 and 112, the solder balls 113 are naturally increased with respect to a plane direction (horizontal direction) of each of the substrates 114 and 115, because the solder balls 113 are spherical.

Accordingly, the area of the upper electrodes 118 formed on the upper surface of the lower substrate 114 and the area of the lower electrodes 138 formed on the lower surface of the upper substrate 115 must be increased in agreement with the size of the solder balls 113. For this reason, a wiring rule applied to the upper surface of the lower substrate 114 and the lower surface of the upper substrate 115 is much restricted by the solder balls 113, which becomes a contributory factor of hindrance to a high density and miniaturization of the system-in-package 100.

Under a method for electrically and mechanically connecting the lower package 111 to the upper package 112 by use of the solder balls 113, an underfill resin must be inserted between the lower package 111 and the upper package 112 in order to enhance reliability. However, processing for inserting the underfill resin is troublesome, which becomes a cause of an increase in the cost of the system-in-package 100.

SUMMARY

Exemplary embodiments of the present invention provide a stacked package which enables high density of wiring and a reduction in the cost of a product regardless of a distance between a substrate which is to serve as an upper layer and a substrate which is to serve as a lower layer, as well as a method for manufacturing the package.

The present invention is characterized by taking measures to be described below.

An invention defined in a first aspect is directed toward a stacked package comprising: a plurality of packages which are stacked one on top of the other while being electrically connected together by use of a connection section, each package having a substrate and an electronic element mounted on the substrate, wherein the connection section has a pillar-like member for supporting the substrate which is to serve as an upper layer on the substrate which is to serve as a lower layer.

Moreover, in an invention defined in a second aspect, the stacked package defined in the first aspect is further characterized in that the pillar-like member is joined to the substrates by use of solder.

In an invention defined in a third aspect, the stacked package defined in the first or second aspect is further characterized in that the pillar-like member is a pin formed from copper.

In an invention defined in a fourth aspect, the stacked package defined in the first or second aspect is further characterized in that the pillar-like member is formed from an elastically-deformable material.

In an invention defined in a fifth aspect, the stacked package defined in the first or second aspect is further characterized in that the pillar-like member is inserted into at least either the substrate which is to serve as the upper layer or the substrate which is to serve as the lower layer.

An invention defined in a sixth aspect is directed toward a method for manufacturing a stacked package comprising a plurality of packages which are stacked one on top of the other while being electrically connected together by use of a connection section, each package having a substrate and an electronic element mounted on the substrate, the method comprising:

an arrangement process for placing a pillar-like member on at least either the substrate which is to serve as a lower layer or the substrate which is to serve as an upper layer; and a joint process for stacking the packages in such a way that the substrate which is to serve as the upper layer is supported on the substrate which is to serve as the lower layer by the pillar-like member and joining the pillar-like member to the substrates.

According to the present invention, the connection sections which stack a plurality of packages one on top of the other in an electrically connected manner are structured by comprising pillar-like members for supporting a substrate which is to serve as an upper layer on a substrate which is to serve as a lower layer, whereby a pitch between the adjacent connection sections can be made smaller. Consequently, an attempt can be made to obtain high density of wiring, improve the degree of freedom of a wiring rule, and miniaturize a stacked package. Further, a necessity for providing an underfill resin between substrates is obviated, so that an attempt can be made to reduce the number of components and cost.

Other features and advantages may be apparent from the following detailed description, the accompanying drawings and the claims.

DETAILED DESCRIPTION

Best modes for practicing the present invention will now be described by reference to the drawings.

Figure 1:
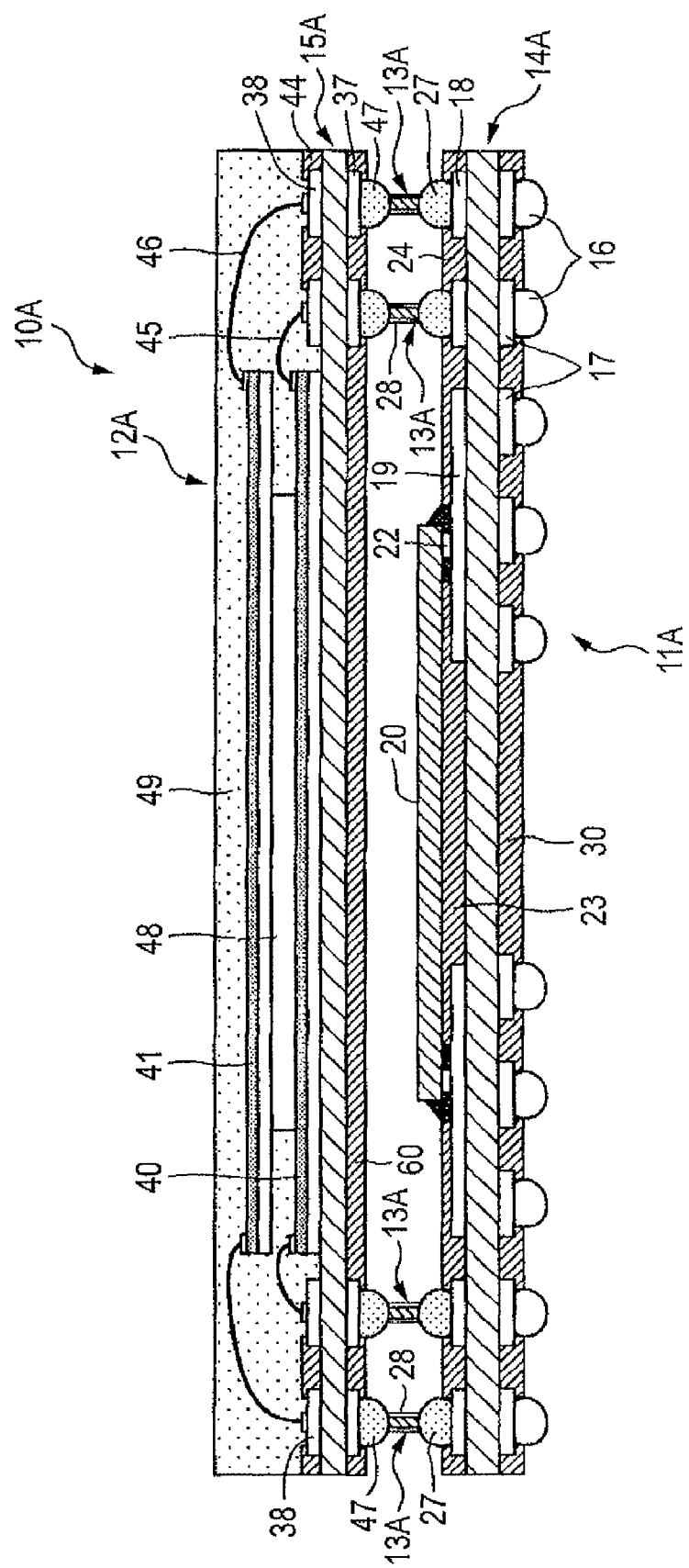
FIG. 1 is across-sectional view showing a semiconductor device according to a first embodiment of the present invention.

FIG. 1 shows a stacked package 10A according to a first embodiment of the present invention. The stacked package 10A shown in the drawing comprises a lower package 11A, an upper package 12A, and connection sections.

The lower package 11A is formed from a lower substrate 14A, solder balls 16, lower electrodes 17, upper electrodes 18, a semiconductor element 20, and the like. The lower substrate 14A is a resin substrate and configured in such a way that a conductor film (e.g., a Cu film) is formed on upper and lower surfaces of a substrate main body formed from an insulating resin by plating or the like.

The conductor film is subject to a predetermined patterning by etching and the like, whereby wiring lines are formed on the upper and lower surfaces of the substrate main body. Portions of lower wiring lines (not shown) formed on the lower surface of the substrate main body constitute the lower electrodes 17, and portions of upper wiring lines 19 formed on the upper surface of the substrate main body constitute the upper electrodes 18. The lower wiring lines and the upper wiring lines 19 are electrically connected together by vias (not shown) formed so as to vertically penetrate through the substrate main body.

Moreover, a lower solder resist 30 is formed on a lower surface of the lower substrate 14A, and an upper solder resist 24 is formed on an upper surface of the lower substrate 14A. Opening sections are formed at positions on the upper solder resist 24 corresponding to positions where the upper electrodes 18 are formed, and opening sections are formed at positions on the lower solder resist 30 corresponding to positions where the lower electrodes 17 are formed. Consequently, the electrodes 17 and 18 are exposed through the solder resists 24 and 30 by way of the opening sections.

Moreover, the solder balls 16 serving as external connection terminals of the stacked package 10A are formed on the lower surface of the lower substrate 14A. The solder balls 16 are provided on the respective lower electrodes 17 exposed through the opening sections formed in the lower solder resist 30.

The semiconductor element 20 is; for example, a logic IC and mounted to the lower substrate 14A by flip-chip bonding in the present embodiment. Specifically, bumps 22 are provided on the semiconductor element 20, and the bumps 22 are bonded to the upper wiring lines 19 formed on the upper surface of the lower substrate 14A by flip-chip bonding, whereby the semiconductor element 20 is mounted on the lower substrate 14A. Moreover, an underfill resin 23 intended for enhancing the reliability of connection is interposed between the semiconductor element 20 and the lower substrate 14A.

In the meantime, the upper package 12A is formed from an upper substrate 15A, semiconductor elements 40 and 41, lower electrodes 37, upper electrodes 38, a sealing resin 49, and the like. The upper substrate 15A is a resin substrate, and a conductor film (e.g., a Cu film) is formed on upper and lower surfaces of a substrate main body formed from an insulating resin by plating, or the like.

The conductor film is subject to a predetermined patterning by etching and the like, whereby wiring lines are formed on the upper and lower surfaces of the substrate main body. Portions of lower wiring lines (not shown) formed on the lower surface of the substrate main body constitute the lower electrodes 37, and portions of upper wiring lines (not shown) formed on the upper surface of the substrate main body constitute the upper electrodes 38. The lower wiring lines and the upper wiring lines are electrically connected together by vias (not shown) formed so as to vertically penetrate through the substrate main body.

Moreover, a lower solder resist 60 is formed on a lower surface of the upper substrate 15A, and an upper solder resist 44 is formed on an upper surface of the upper substrate 15A. Opening sections are formed at positions on the upper solder resist 44 corresponding to the positions where the upper electrodes 38 are formed, and opening sections are formed at positions on the lower solder resist 60 corresponding to the positions where the lower electrodes 37 are formed. Consequently, the electrodes 37 and 38 are exposed through the solder resists 44 and 60 by way of the opening sections.

The semiconductor elements 40 and 41 are; for example, memory ICs and mounted, in a stacked manner, on the upper substrate 15A by way of a spacer 48. The semiconductor elements 40 and 41 are electrically connected to the upper electrodes 38 formed on the upper substrate 15A by wires 45 and 46.

The sealing resin 49 is an insulating resin; for example, epoxy or the like, and is formed so as to seal the respective semiconductor elements 40, 41 and the wires 45, 46. The sealing resin 49 can be formed by; for example, transfer molding.

The stacked package 10A of the present embodiment is configured so as to achieve a high density and a smaller mounting area by stacking the upper package 12A configured as mentioned above on the lower package 11A. Specifically, the upper package 12A is stacked on the lower package 11A by use of the connection sections.

The connection sections exhibit a function of supporting the upper package 12A on the lower package 11A and electrically connecting the packages 11A and 12A to each other. In the stacked package 10A of the present embodiment, the connection sections are characterized by being formed from pillar-like members 13A and solder joint sections 27 and 47. The connection sections formed from the pillar-like members 13A and the solder joint sections 27 47 will be described hereunder.

Figure 7:
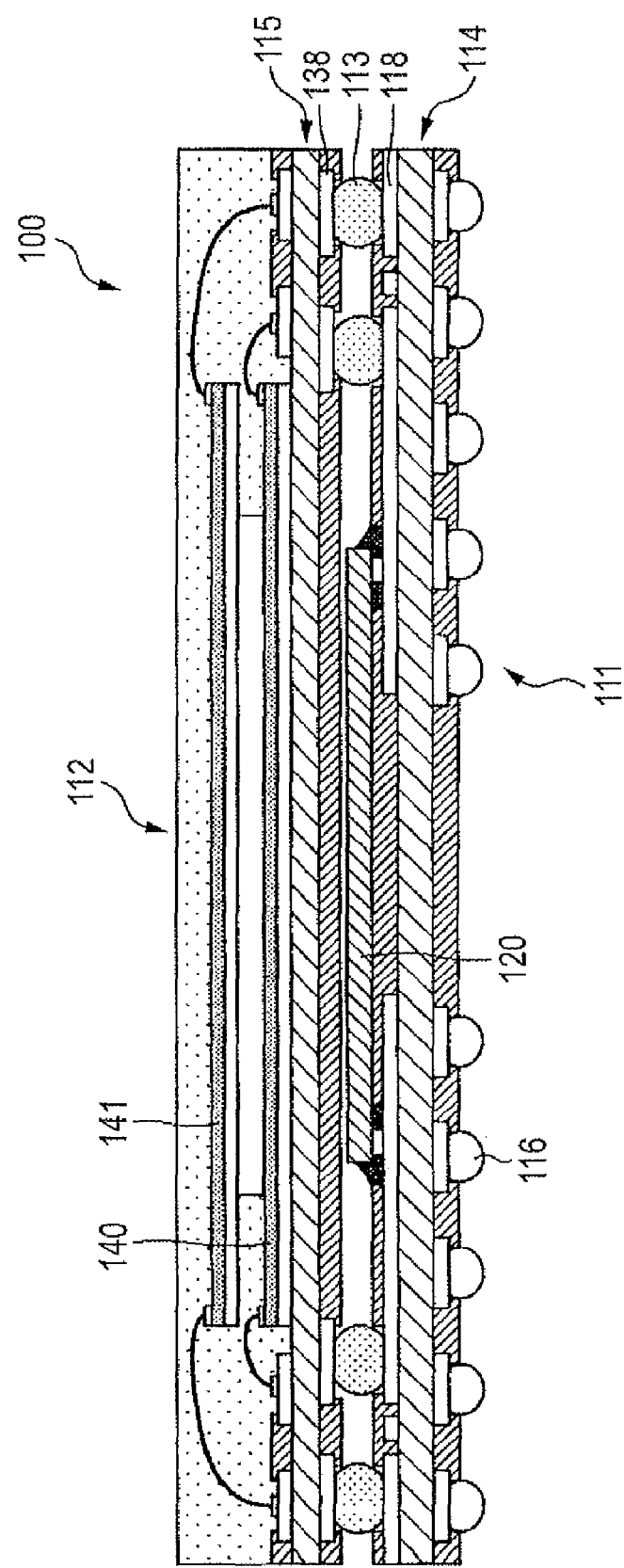
FIG. 7 is a cross-sectional view of a system-in package according to an example of the related art.

The semiconductor element 20 used in the present embodiment generates a high temperature during operation. Therefore, in the stacked package 10A of the present embodiment, the upper package 12A is desired to be spaced away from the lower package 11A in order to enhance heat dissipation of the semiconductor element 20. However, when the configuration of the related-art system-in-package 100 described in connection with FIG. 7 is applied to this package, the solder balls 113 for stacking purpose become increased in size, thereby raising a problem hindering achievement of high density and miniaturization, as mentioned previously.

However, in the present embodiment, the connection sections of the present embodiment are formed from the pillar-like members 13A and the solder joint sections 27 and 47. The pillar-like members 13A are pins which are formed from copper and have a columnar shape, and a surface film 28, such as gold plating, is formed on the surface of the pillar-like members. The pillar-like members 13A are formed from a material which is harder than solder conventionally used for the joint sections and which exhibits higher rigidity. Therefore, even when the pillar-like members have a small diameter, the pillar-like members can provide a support function (a function for supporting the upper package 12A on the lower package 11A) equivalent to that provided by the related-art solder balls 113 for stacking purpose. Moreover, copper is superior to solder in electrical conductivity in connection with an electrical property. Hence, use of the pillar-like members 13A in place of the solder balls 113 for stacking purpose enables making of an attempt to enhance the electrical characteristic achieved between the lower package 11A and the upper package 12A.

Lower ends of the pillar-like members 13A are connected to the upper electrodes 18 formed on the lower package 11A by use of solder (joined sections are called solder joint sections 27). Moreover, upper ends of the respective pillar-like members 13A are joined to the lower electrodes 37 formed on the upper package 12A by use of solder (joined sections are called solder joint sections 47). Thus, the upper package 12A is stacked on the lower package 11A by the connection sections formed from the pillar-like members 13A and the solder joint sections 27 and 47.

The stacked package 10A of the present embodiment is configured in such a way that the upper package 12A is stacked on the lower package 11A by use of the pillar-like members 13A. The diameter of the pillar-like members 13A (a diameter of a cross section of the pillar-like member) can be determined in terms of only mechanical strength which enables supporting of the upper package 12A, without being affected by a space between the lower package 11A and the upper package 12A.

Therefore, even when the space between the lower package 11A and the upper package 12A is increased, the diameter of the pillar-like members 13A used in the present embodiment can be reduced when compared with the solder balls 113 for stacking purpose employed as the connection sections in the related art. As a result, a pitch between the adjacent pillar-like members 13A can be reduced, and an attempt can be made to decrease the area of the upper electrodes 18 and the area of the lower electrodes 37. Hence, an attempt can be made to obtain the high density of wiring, improve the degree of freedom of the wiring rule, and miniaturize the stacked package 10A. Further, a necessity for interposing an underfill resin between the lower package 11A and the upper package 12A is obviated, and an attempt can also be made to reduce the number of components and cost.

The pillar-like members 13A may also be formed into an elastically-deformable configuration or formed from an elastically-deformable material. In the case where the pillar-like members are formed into an elastically-deformable configuration, when external force or stress has been imposed on either the lower package 11A or the upper package 12A, the external force or stress is absorbed by elastic deformation of the pillar-like members 13A, thereby preventing transmission of force or stress to an other package Consequently, a highly-reliable stacked package which is resistant to external force and stress can be embodied by adopting of the configuration. For example, the elasticity modulus of the elastically-deformable material is from 100 to 230 gigapascal. Further, a spring material such as beryllium copper, phosphor bronze, or the like may be used as the elastically-deformable material.

Figure 5:
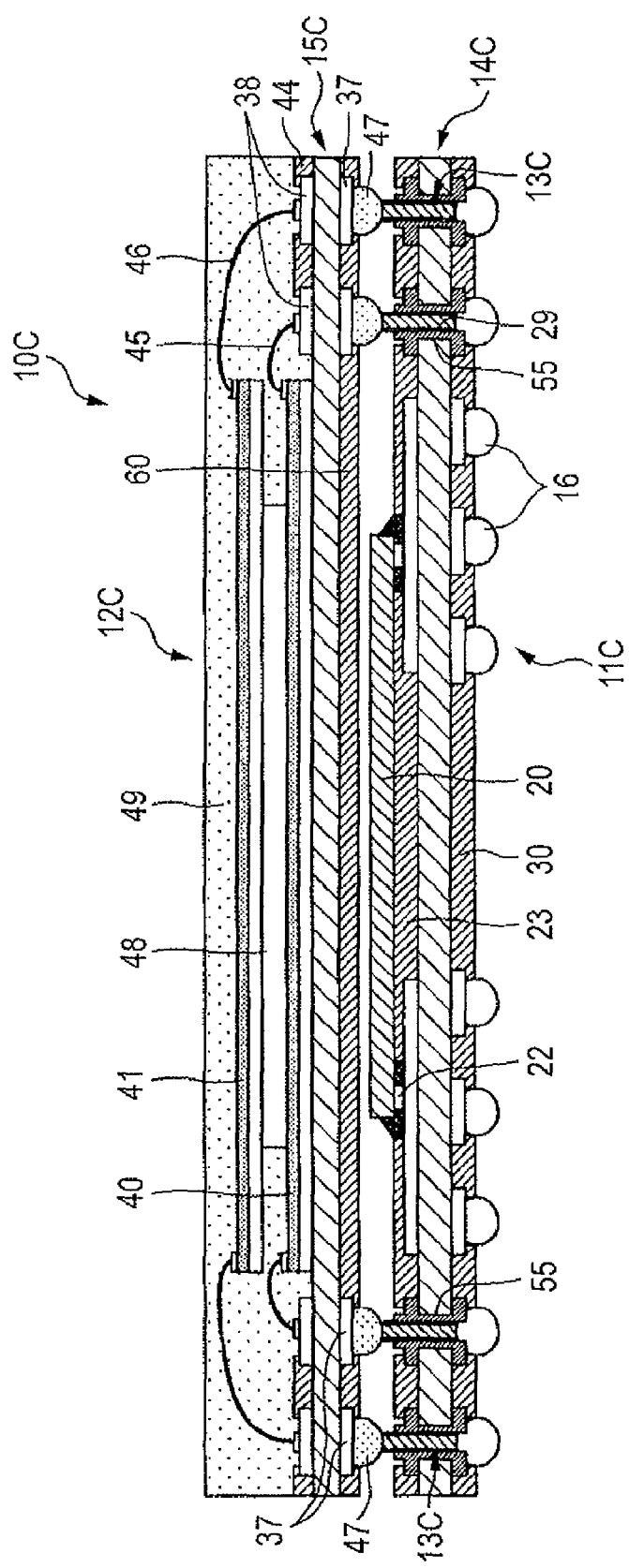
FIG. 5 is a cross-sectional view showing a semiconductor device according to a third embodiment of the present invention.

The above embodiment has described an example where a pillar-like member having a circular cross-sectional profile is used for the pillar-like members 13A. However, the pillar-like members 13A are not limited to such a shape but may assume another shape, such as a cross-sectional rectangular profile or a triangular shape. Moreover, strength and the degree of elasticity may be changed by adjusting the cross-sectional area or length of the pillar-like members 13A. Furthermore, the shape of the pillar-like members 13A does not need to be a linear shape. In order to achieve an elastically-deformable configuration such as that mentioned above, a curved portion may also be formed in each of the pillar-like members 13A. Although the pillar-like members 13A can have various shapes, the circular cross-sectional profile is more preferable because the external force or stress is easy to be dispersed and the insertion into insertion holes of the lower substrate as shown in FIG. 5 is easy to be performed. For example, the pillar-like members 13A has the circular cross-sectional profile, preferably, its diameter is from 100 to 200 μm and its length is from 200 to 500 μm.

Although solder is used as the solder joint sections 27 and 47 even in the present embodiment, suffice amounts of solder joint sections 27 and 47 are to enable fixing of the pillar-like members 13A to the respective electrodes 18 and 37. Therefore, even when solder is used for bonding the pillar-like members 13A to the respective electrodes 18 and 37, worsening of high density or an increase in size, which would otherwise arise in the related art, does not arise.

A method for manufacturing the stacked package 10A configured as mentioned above will then be described. FIG. 2 is a view showing manufacturing process of the method for manufacturing the stacked package 10A. In FIG. 2, the configuration which is the same as that shown in FIG. 1 is assigned the same reference, and its explanation is omitted.

Figure 2A:
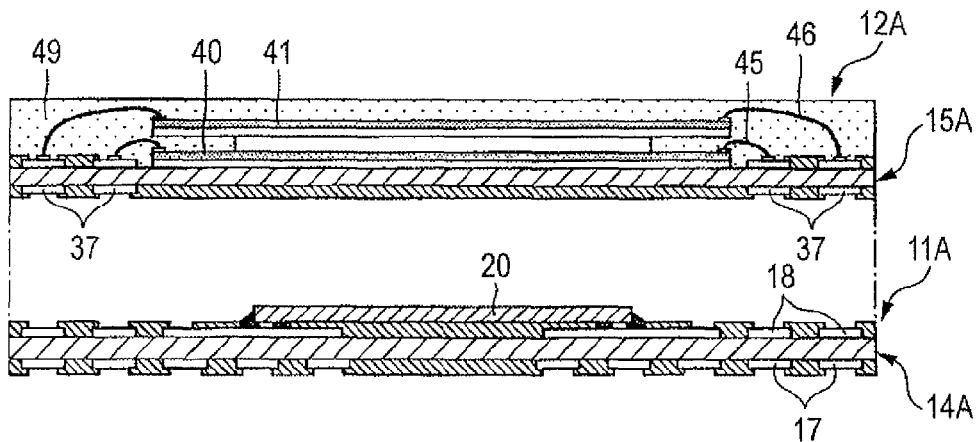
FIGS. 2A to 2C are views for describing a method for manufacturing the semiconductor device of the first embodiment.

At the time of manufacture of the stacked package 10A, the lower package 11A and the upper package 12A, which have been manufactured through separated processes, are first prepared as shown in FIG. 2A.

Figure 2B:
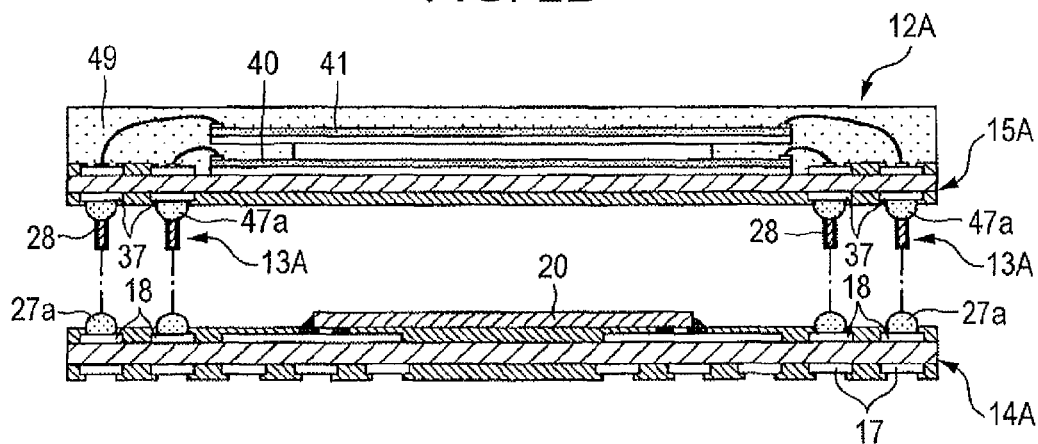
Figure 2C:
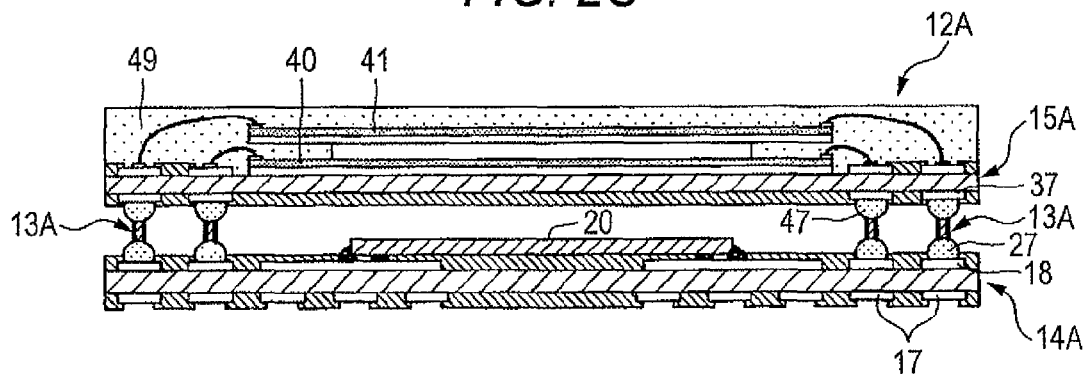

Subsequently, as shown in FIG. 2B, solder cream 27a which is to serve as the solder joint sections 27 is provided on the upper electrodes 18 of the lower substrate 14A, and solder cream 47a which is to serve as the solder joint sections 47 is provided on the lower electrodes 37 on the upper substrate 15A. The pillar-like members 13A are arranged on either the solder cream 27a or 47a (an arrangement process). In an example shown in FIG. 2B, the pillar-like members 13A are arranged on the solder cream 47a provided on the upper substrate 15A.

After completion of the arrangement process, the upper package 12A is next mounted on the lower package 11A. At this time, the pillar-like members 13A are arranged on the upper substrate 15A so as to be inserted into the solder cream 27a provided on the lower substrate 14A. Thereby, the upper package 12A is temporarily arranged on the lower package 11A by way of the pillar-like members 13A and the solder creams 27a and 47A.

The solder creams 27a, 47a are in the form of a paste and posses a soft property. Therefore, when the upper package 12A is heavy, it may be the case where the upper package 12A will becomes unstable on the lower package 11A. In this case, there may also be adopted a configuration where the upper package 12A is supported on the lower package 11A by use of a jig until after reflow processing to be described later.

When the upper package 12A is temporarily mounted on the lower package 11A as mentioned above, the lower package 11A and the upper package 12A are put into a reflow furnace in this state, where the packages are subjected to reflow processing. Thereby, solder contained in the solder creams 27a and 47a becomes melt, and volatile components are eliminated. The pillar-like members 13A are bonded to the lower electrodes 37 by the solder joint sections 47, as well as being bonded to the upper electrodes 18 by the solder joint sections 27 (a joint process).

As mentioned above, according to the manufacturing method of the present embodiment, the stacked package 10A can be manufactured efficiently and easily. Although the lower electrodes 17 are subjected to a process of formation of the solder balls 16 after completion of the joint process, this process is performed by use of a known method, and hence its explanation is omitted.

Figure 3:
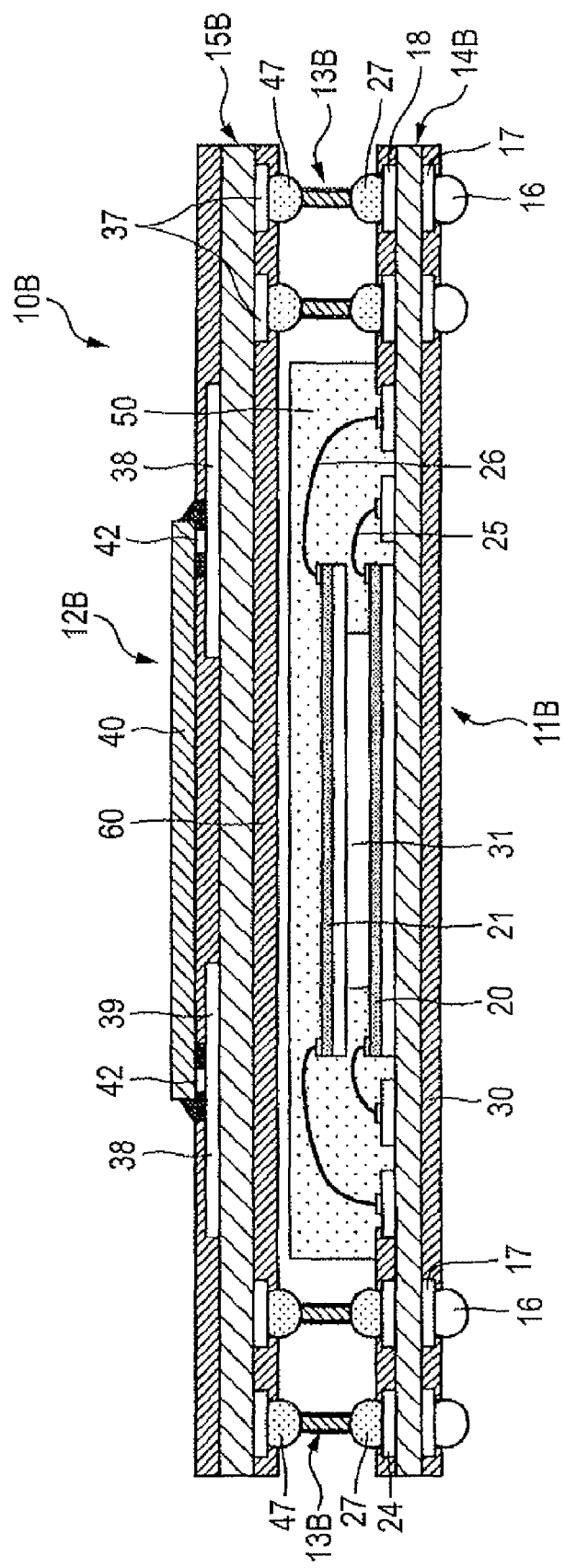
FIG. 3 is a cross-sectional view showing a semiconductor device according to a second embodiment of the present invention.
Figure 4A:
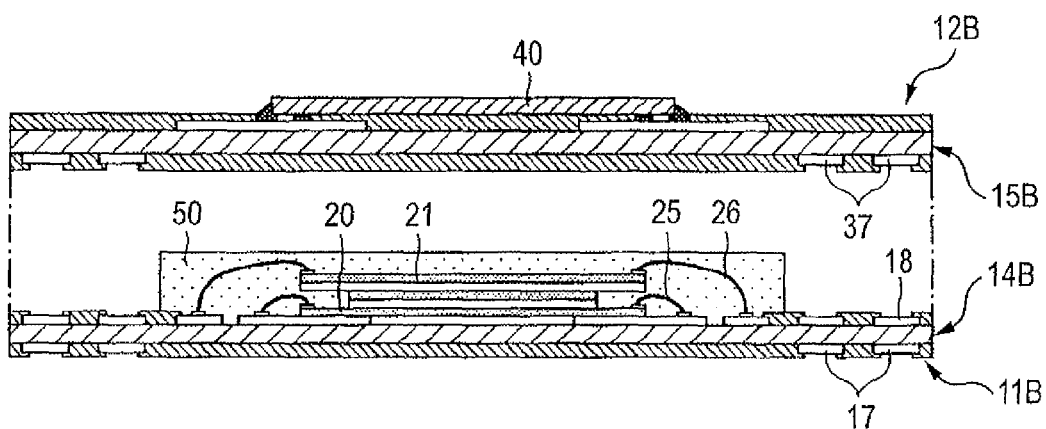
FIGS. 4A to 4C are views for describing a method for manufacturing the semiconductor device of the second embodiment.
Figure 4B:
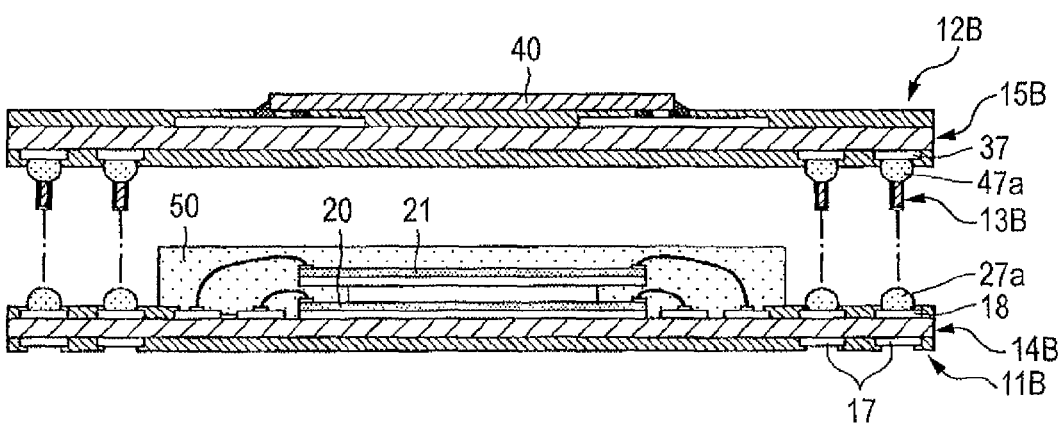
Figure 4C:
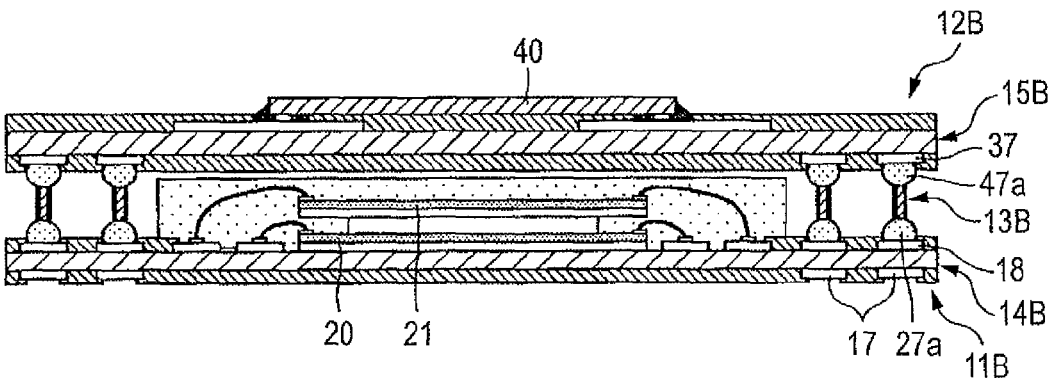

Subsequently, another embodiment of the present invention will be described. FIGS. 3 and 4 are views for describing a stacked package 10B according to a second embodiment of the present invention and a method for manufacturing the package. FIGS. 5 and 6 are views for describing a stacked package 10C according to a third embodiment of the present invention and a method for manufacturing the package. In FIGS. 3 through 6, structures corresponding to the structures shown in FIGS. 1 and 2 are assigned the same reference numerals, and their explanations are omitted.

The stacked package 10B of the second embodiment shown in FIG. 3 is characterized in that a plurality of semiconductor elements 20 and 21 (two in the present embodiment) are stacked on a lower package 11B.

The lower package 11B is structured in such a way that the semiconductor element 20 and the semiconductor element 21 are stacked on an upper surface of a lower substrate 14B by way of a spacer 31. Further, the respective semiconductor elements 20, 21 are electrically connected to the lower substrate 14B by wires 25 and 26.

A sealing resin 50 is formed so as to seal the respective semiconductor elements 20 and 21 and the wires 25 and 26. A range where the sealing resin 50 is formed is limited to areas where the respective semiconductor elements 20 and 21 and the wires 25 and 26 are formed. Upper electrodes 18 where pillar-like members 13B are to be provided are formed so as to become exposed through the solder resist.

In the meantime, in the present embodiment, an upper substrate 15B is structured in such a way that only one semiconductor element 40 is provided. The semiconductor element 40 is bonded to upper electrodes 38 by use of bumps 42 by flip-chip bonding.

Incidentally, as in the present embodiment, it may be the case where, in the stacked package 10B, the plurality of semiconductor elements 20 and 21 must be stacked on the lower package 11B that is to serve as a lower layer. In the structure, the plurality of semiconductor elements 20 and 21 are stacked on the lower substrate 14B that is to serve as a lower layer. Hence, the overall height of the lower package 11B becomes high. In particular, in the case of the structure where the semiconductor elements 20, 21 and the lower substrate 14B are connected together by the wires 25 and 26, as in the case of the present embodiment, the sealing resin 50 is formed so as to seal the wires 25 and 26, and hence the height of the lower package 11B becomes greater (this will be hereinafter referred to as a "higher-profile phenomenon").

In the structure where the profile of the lower package 11B has become increased, when the upper package 12B is stacked on the lower package 11B, a distance between the lower substrate 14B and the upper substrate 15B becomes greater inevitably. Therefore, a package whose profile is to be increased has hitherto been taken as an upper package in the related art and a package whose profile is to remain low has been taken as a lower package.

However, when the types of the packages are limited as mentioned above, the degree of freedom of a circuit configuration of an stacked package (a system-in package) is hindered, which raises a problem of difficult in acquiring desired electrical characteristics. Moreover, when the package whose profile has been increased in order to achieve a desired electrical characteristic is taken as a lower package, the stacked package will become bulky.

In contrast, in the present embodiment, the pillar-like members 13B and the solder joint sections 27 and 47 are used as connection sections. Therefore, a higher-profile package can be taken as the lower package 11B, and an attempt can be made to miniaturize the stacked package 10B while desired electrical characteristics are acquired.

FIG. 4 shows a method for manufacturing the above-mentioned stacked package 10B. As illustrated, the stacked package 10B of the present embodiment can be manufactured by processes which are essentially the same as those of the method for manufacturing the stacked package 10A described by reference to FIG. 2. Consequently, even when the profile of the lower package 11B is increased, the stacked package 10B can be manufactured efficiently and readily.

FIG. 5 shows the stacked package 10C of the third embodiment. The stacked package 10C is characterized in that at least either upper or lower ends of respective pillar-like members 13C constituting the connection sections are inserted into insertion holes formed in an upper or lower substrate.

In the present embodiment, upper ends of the pillar-like members 13C are bonded to lower electrodes 37 of an upper package 12C (an upper substrate 15C) by use of solder joint sections 47, and lower ends of the pillar-like members 13C are inserted into the insertion holes 29 formed in a lower package 11C (a lower substrate 14C).

Electrodes 55 are formed in the respective insertion holes 29 of the lower substrate 14C, and the pillar-like members 13C are inserted into the respective insertion holes 29, to thus become electrically connected to the electrodes 55. The electrodes 55 may also be formed by through holes or vias, or contact components may also be provided separately.

By means of configuration of the present embodiment, the pillar-like members 13C are retained while their portions are inserted into the respective insertion holes 29 formed in the lower substrate 14C. Hence, the pillar-like members 13C can be fastened firmly. Therefore, the upper package 12C can be reliably supported on the lower package 11C by the pillar-like members 13C, and the reliability of the stacked package 10C can be enhanced further.

The embodiment shows the structure where the insertion holes 29 into which the pillar-like members 13C are inserted are formed in only the lower package 11C. However, the insertion holes into which the pillar-like members 13C are inserted may be formed in the upper package 12C or the insertion holes may be formed in both the respective packages 11C and 12C. Further, in order to have more reliable electrical and mechanical connection between the pillar-like members 13C and the electrodes 55, there may also be adopted the structure where the pillar-like members 13C and the electrodes 55 are soldered to the surface of the substrate.

A method for manufacturing the stacked package 10C configured as mentioned above will then be described.

Figure 6A:
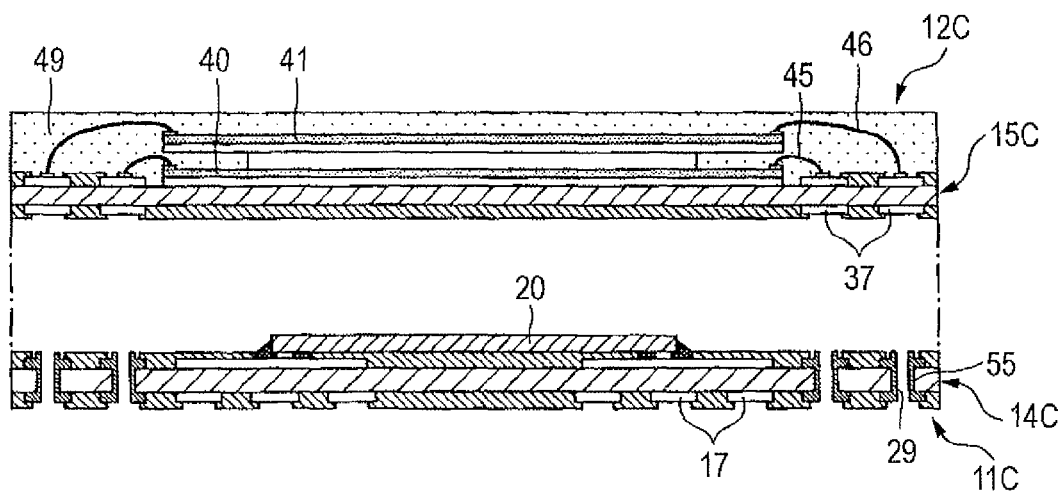
FIGS. 6A to 6C are views for describing a method for manufacturing the semiconductor device of the second embodiment.

First, as shown in FIG. 6A, the lower package 11C and the upper package 12C, which have been separately manufactured through different processes, are prepared in order to manufacture the stacked package 10C. At this time, the insertion holes 29 having electrodes 55 are formed in positions on the lower package 11C where the pillar-like members 13C are to be provided.

Subsequently, the solder cream 47a which is to serve as the solder joint sections 47 is provided on the lower electrodes 37 of the upper substrate 15C, and the pillar-like members 13C are provided (temporarily provided) on the solder cream 47a. In the present embodiment, after the pillar-like members 13C have been temporarily provided on the solder cream 47a as mentioned above, the upper package 12C is placed in the reflow furnace, where the package is subjected to reflow processing. As a result, solder contained in the solder cream 47a is fused, and volatile components of the cream are eliminated, whereby the pillar-like members 13C are bonded to the lower electrodes 37 by the solder joint sections 47.

Figure 6B:
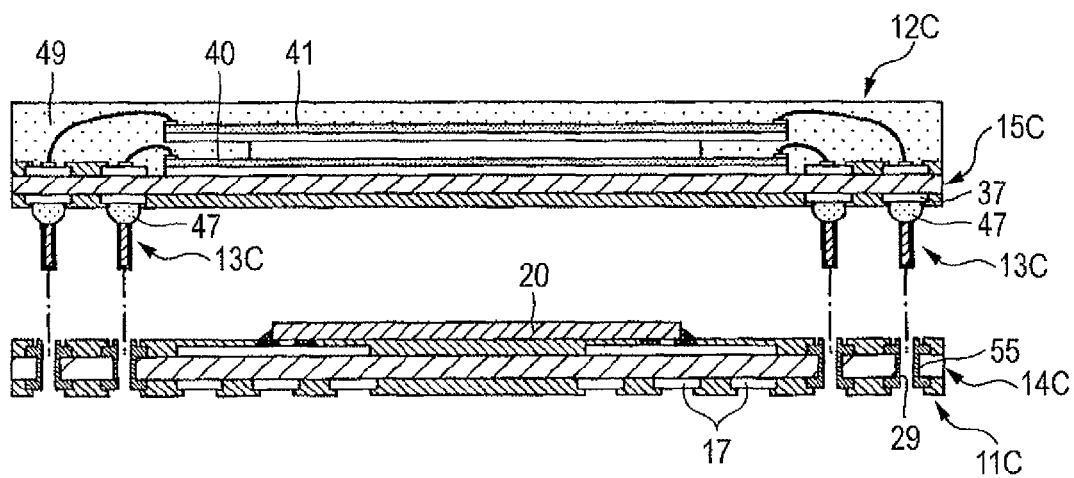

When the pillar-like members 13C are bonded to the upper substrate 15C (the lower electrodes 37) as mentioned above, the upper package 12C is positioned on the lower package 11C in such a way that the pillar-like members 13C oppose the respective insertion holes 29 as shown in FIG. 6B.

Figure 6C:
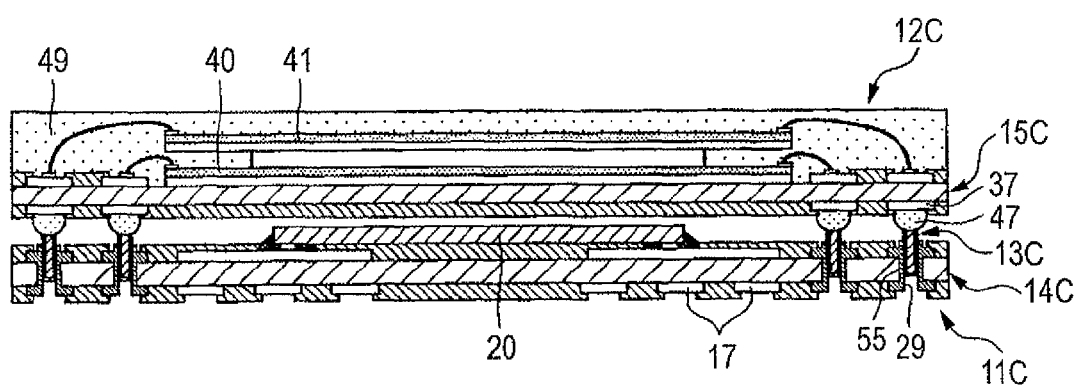

Subsequently, as shown in FIG. 6C, the upper package 12C is mounted on the lower package 11C. At this time, the pillar-like members 13C provided on the upper substrate 15C are attached so as to become inserted into the respective insertion holes 29 formed in the lower substrate 14C. Thereby, the upper package 12C is stacked on the lower package 11C. After completion of stacking operation, the lower electrodes 17 are subjected to the process of manufacture of the solder balls 16.

As mentioned above, according to the manufacturing method of the present embodiment, the stacked package 10C for which an attempt can be made to achieve higher reliability can be manufactured efficiently and simply, as a result of insertion of the pillar-like members 13C into the respective insertion holes 29.

Although the above embodiments have illustrated the examples where the pillar-like members 13A to 13C of pins are used as connection sections, the pillar-like members are not always pins. For instance, bonding wires are connected to lower electrodes by a wire bonding apparatus, and the wires are cut after having been fed upwardly, thereby forming the pillar-like members from the wires.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A stacked package comprising:
   an upper package, including:
   a substrate having an upper surface and a lower surface;
   a solder resist formed on the upper surface of the substrate;
   a solder resist formed on the lower surface of the substrate;
   electrode pads being exposed from opening portions in the solder resist formed on the upper surface of the substrate;
   electrode pads being exposed from opening portions in the solder resist formed on the lower surface of the substrate;
   a semiconductor element mounted on one of the upper surface or the lower surface of the substrate; and
   solder joint sections formed on respective electrode pads exposed from the opening portions in the solder resist formed on the lower surface of the substrate;
   a lower package, including:
   a substrate having an upper surface and a lower surface;
   a solder resist formed on the upper surface of the substrate of the lower package;
   a solder resist formed on the lower surface of the substrate of the lower package;
   electrode pads being exposed from opening portions in the solder resist formed on the upper surface of the substrate of the lower package;
   electrode pads being exposed from opening portions in the solder resist formed on the lower surface of the substrate of the lower package;
   a semiconductor element mounted on one of the upper surface or the lower surface of the substrate of the lower package inside of the electrode pads;
   solder joint sections formed on respective electrode pads exposed from the opening portions in the solder resist formed on the upper surface of the substrate; and
   external connection terminals formed on respective electrode pads exposed from the opening portions in the solder resist formed on the lower surface of the substrate of the lower package; and
   a connection section electrically connecting the upper package and the lower package;
   wherein the connection section includes a pillar-like member supporting the substrate of the upper package on the substrate of the lower package and forming a space between the upper package the lower package, ends of the pillar-like member being embedded in the solder joint sections of the upper and lower packages, and the semiconductor element of the lower package being disposed in the space, and wherein the elastically-deformable material has an elasticity modulus of 100-230 gigapascals.

2. The stacked package according to claim 1, wherein the pillar-like member is joined to the substrates by use of solder.

3. The stacked package according to claim 1, wherein the pillar-like member is a pin formed from copper.

4. The stacked package according to claim 1, wherein the pillar-like member is inserted into at least either the substrate which is to serve as the upper layer or the substrate which is to serve as the lower layer.

5. The stacked package according to claim 1, wherein the pillar-like member has a length of 200-500 μm.

6. The stacked package according to claim 1, wherein the pillar-like member includes a curved portion that provides elastic deformation of the pillar-like member.

7. The stacked package according to claim 1, wherein the pillar-like member includes a surface film formed on a surface of the pillar-like member.

8. The stacked package according to claim 1, wherein a plurality of semiconductor elements are mounted in the upper package.

9. The stacked package according to claim 1, comprising a sealing resin formed on the upper package and covering the surface of the substrate on which the semiconductor element is mounted.

* * * * *